United States Patent [19]

Morrison, Jr.

[11] 4,448,659

[45] May 15, 1984

[54] METHOD AND APPARATUS FOR EVAPORATION ARC STABILIZATION INCLUDING INITIAL TARGET CLEANING

[75] Inventor: Charles F. Morrison, Jr., Boulder, Colo.

[73] Assignee: VAC-TEC Systems, Inc., Boulder, Colo.

[21] Appl. No.: 531,258

[22] Filed: Sep. 12, 1983

[51] Int. Cl.³ .............................................. C23C 15/00
[52] U.S. Cl. ................................ 204/192 R; 118/723; 204/298; 427/42
[58] Field of Search .......................... 427/42; 118/723; 204/192 R, 298

[56] References Cited

U.S. PATENT DOCUMENTS

| | | | |
|---|---|---|---|
| 2,972,695 | 2/1961 | Wroe | 313/157 |
| 3,625,848 | 12/1971 | Snaper | 204/192 R |
| 3,783,231 | 1/1974 | Sablev et al. | 219/123 |
| 3,793,179 | 2/1974 | Sablev et al. | 204/298 |
| 3,836,451 | 12/1974 | Snaper | 204/298 |
| 4,180,450 | 12/1979 | Morrison | 204/298 |
| 4,391,679 | 7/1983 | Morrison | 204/298 |

OTHER PUBLICATIONS

Naoe et al., Jap. J. Appl. Phys. 10, (1971), Jun. 71, pp. 747-753.
Rakhovskii, IEEE Transactions of Plasma Science, vol. PS-4, No. 2, 1976, pp. 81-99.

*Primary Examiner*—Arthur P. Demers
*Attorney, Agent, or Firm*—Gerald J. Ferguson, Jr.; Joseph J. Baker

[57] ABSTRACT

Apparatus and method for evaporation arc stabilization including a target having a surface of material of non-permeable material to be evaporated; circuitry for establishing an arc on the target surface for evaporating the target material, the arc being characterized by the presence of charged particles and a cathode spot which randomly migrates over the target surface; and a confinement ring surrounding the target surface, the ring being composed of a magnetically permeable material to confine the cathode spot to the target. The anode is closely spaced to the ring to prevent the arc from moving off the target and the ring, during initial arc cleaning of the target. In lieu of the magnetically permeable confinement ring, the anode itself may be permeable. Various configurations of the confinement ring are also disclosed together with various features for improving the operation thereof.

101 Claims, 24 Drawing Figures

METHOD AND APPARATUS FOR EVAPORATION ARC STABILIZATION INCLUDING INITIAL TARGET CLEANING

RELATED PATENT APPLICATIONS

This application is related to application Ser. No. 492,831 filed May 9, 1983 by William M. Mularie entitled "Evaporation Arc Stabilization". It is also related to an application entitled "Improved Apparatus and Method For Evaporation Arc Stabilization For Non-Permeable Targets Utilizing Permeable Stop Ring" filed by Anthony R. T. Lefkow on even date herewith. Furthermore, it is also related to an application entitled "Improved Method and Apparatus for Evaporation Arc Stabilization For Permeable Targets" filed by William M. Mularie on even date herewith. All of the above applications are assigned to the assignee of the present application.

BACKGROUND OF THE INVENTION

This invention relates to arc coating processes and devices such as are disclosed in U.S. Pat. Nos. 3,625,848 and 3,836,451 to Alvin A. Snaper and U.S. Pat. Nos. 3,783,231 and 3,793,179 to L. Sablev, et al. These systems are characterized by high deposition rates and other advantageous features. However, these advantages can be somewhat offset due to instability of the arc. That is, the arc involves currents of about 60 amperes, or more, concentrated into a cathode spot so small that current densities are $10^3$ to $10^6$ amperes per square inch. The voltages are 15 to 45 volts. Thus, power densities at the tiny cathode spot are in the order of megawatts/inch$^2$. Accordingly, local violence is an understatment. The target surface under the cathode spot flash evaporates from the intense heat. It is this evaporated target material which deposits as the coating on a substrate. The cathode spot migrates about the target surface in a random, jerky motion with reported velocities of many meters per second. Because of this random movement, damage to the device and contamination of the coating can occur if the spot moves off the target surface.

Different solutions to the arc instability problem have been proposed. Thus, in Sablev, et al., U.S. Pat No. 3,793,179, a shield is placed close to the edge of the target. In particular, it is placed at a distance from the target which represents less than a mean free path of the gas present. In an arc discharge, gas and plasma are generated at the cathode spot with sufficient violence that local mean-free-paths may occasionally be reduced to a few thousandths of an inch. When such a blast of local high pressure is blown under the shield, which is spaced at several millimeters (~80 thousandths of an inch), there is finite possibility the arc can migrate under the shield. When this happens, there will be arc damage to the cathode, contamination of the evaporant, or the arc will extinguish.

Sablev, et al. U.S. Pat. No. 3,783,231 (copy submitted herewith) apparently addresses the foregoing problem by providing a feedback mechanism of some complexity that emphasizes the frustrations caused by the problem. The feedback involves the utilization of a magnetic field to retain the cathode spot on the target surface. U.S. Pat. No. 2,972,695 (copy submitted herewith) to H. Wroe also suggests the utilization of a magnetic field for cathode spot retention.

A problem related to that of arc stabilization is the need for ultra-clean conditions for the target assembly. That is, the target surface usually initially includes contaminants such as oxides and the like. Since the oxides emit copious amounts of electrons, the arc initially prefers to locate itself at such sites until the oxide contaminant is evaporated away. Only after all such sites are evaporated can meaningful evaporation of the target commence during the target evaporation phase. During this initial cleaning phase, the arc may move onto the back and sides of the cathode where, as discussed above, it may damage the structure or evaporate contaminating metals into the chamber.

As will be described hereinafter, certain embodiments in accordance with the present invention are subject to the above-discussed problems during the initial cleaning phase. However, once this phase is completed, control of the arc becomes quite complete in these embodiments during the target evaporation phase. Nevertheless, steps must be taken to avoid the problems arising during the initial cleaning phase.

SUMMARY OF THE INVENTION

It is an object of the present invention to provide, in an arc evaporation process, stabilization of the arc in such a manner as to avoid the inadequacies and complexities of the prior art approaches.

It is a further object to provide an improved method and apparatus for cleaning targets preparatory to the arc evaporation thereof.

It is a further object to provide a method and apparatus of the above type incorporating various improved configurations for arc stabilization and target shielding.

It is a further object of this invention to provide arc stabilization and/or target cleaning of the above type for use in arc coating processes.

Other objects and advantages of the invention will be apparent from a reading of the following specification and claims taken with the drawing.

BRIEF DESCRIPTION OF THE DRAWING

FIGS. 10(a) and 19(b) are an end view and a cross-sectional side elevation view respectively of a further illustrative non-planar target with P-ring stops.

DETAILED DESCRIPTION OF PREFERRED EMBODIMENTS OF THE INVENTION

Reference should be made to the drawing where like reference numerals refer to like parts.

Prior to discussing in detail an illustrative embodiment of the present invention, the invention of the before-mentioned co-pending application entitled "Improved Method and Apparatus for Evaporation Arc Stabilization for Non-Permeable Targets Utilizing Permeable Stop Ring" will be discussed in detail with respect to FIG. 1 since the latter invention is employed in the present invention.

Figure 1:
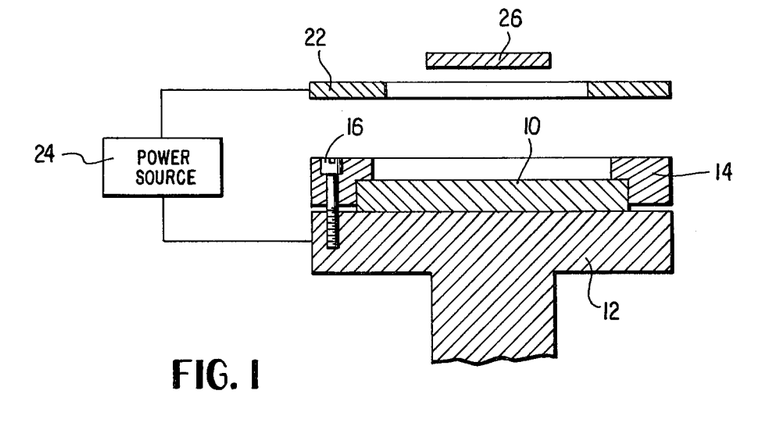
FIG. 1 is a schematic diagram in cross-section of an illustrative embodiment of an arc stabilization apparatus as disclosed in the before-mentioned co-pending application entitled "Improved Method and Apparatus for Evaporation Arc Stabilization for Non-Permeable Targets Utilizing Permeable Stop Ring".

Referring to FIG. 1, there is shown a non-permeable target 10 retained to a water cooled cathode body 12 by an arc confinement ring 14. The ring is made of a magnetically permeable material such as soft iron or Permalloy. In fact, any material considered to be permeable may be used, such materials including but not limited to iron; nickel; cobalt; and alloys thereof with small amounts of optional additives; ferrites; steel; etc. As will be discussed further below, it is the permeable character of the ring which retains the arc on the non-permeable target thereby effecting the desired arc stabilization in a rugged yet inexpensive manner. Furthermore, the ring may retain the target with respect to the cathode body as indicated by bolt 16. Permeable ring 14 will hereafter sometimes be referred to as a "P-ring".

Also diagrammatically shown in FIG. 1 are conventional elements employed in arc evaporation coating including an anode 22, a power source 24 and a substrate 26. Means (not shown) are typically employed to strike an arc between the anode and target, which is typically at cathode potential. The arc is characterized by the presence of charged particles and a cathode spot which randomly migrates over the target surface. Once the arc is established, the target material is evaporated in a unique manner due to the high energy of the arc where the mean charged particle energies thereof can extend from 20–100 eV and typically from 40–60 eV. The evaporated material is coated on the substrate where, in certain instances, the substrate may also function as the anode. Furthermore, the non-permeable target may comprise an electrically conductive material such as a metal or a electrically insulative material. Typically, the power source 26 is DC for electrically conductive targets and RF for electrically insulative targets. Additionally, the target and cathode, in some instances, may comprise the same member.

Arc stabilization is effected in the above-mentioned pending application Ser. No. 492,831 by surrounding the target with a confinement ring made of a material such as boron nitride or titanium nitride. Hereinafter, this type ring will be termed an "N-ring".

Although there is no intent to be limited to a particular theory of operation, the following considerations apparently are applicable to the arc containment characteristic of a P-ring. It has been observed a vacuum arc struck on a non-permeable target wanders randomly about, most often leaving the target for other areas of the cathode within a second or so. A permeable target looses the arc to other cathode areas in milliseconds. Obviously, for uncontaminated coatings, the arc must remain only on the target.

Figure 2A:
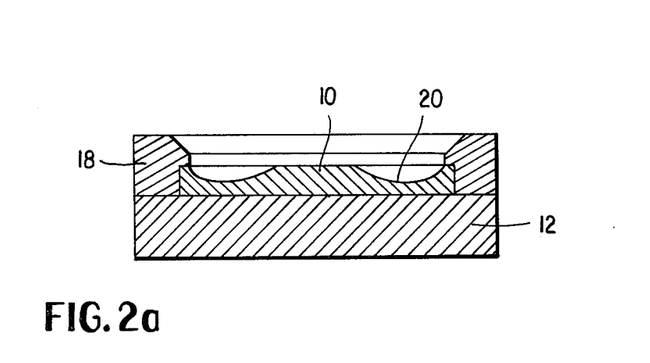
FIG. 2(a) is a schematic diagram in cross-section illustrating the erosion pattern which results when a permeable target is confined by an N-ring.
Figure 2B:
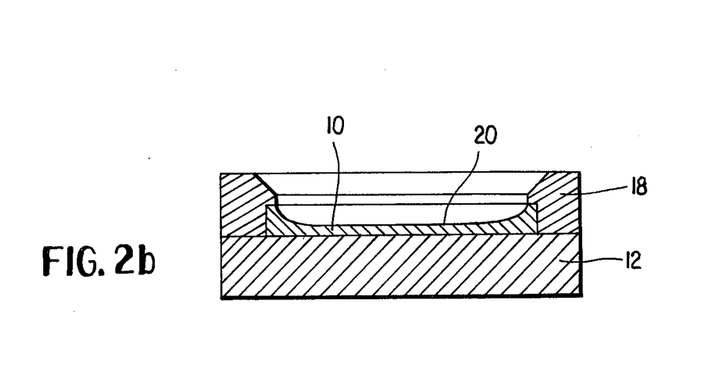
FIG. 2(b) is a schematic diagram in cross-section which illustrates the uniform erosion pattern which results when a non-permeable target is confined by a N-ring in accordance with the above-mentioned, pending application Ser. No. 492,831.

With respect to the fast loss of arc from unguarded permeable targets, an attempt was made by the assignee of the present application to arc evaporate a circular target of Permalloy bounded by an N-ring. This resulted in erosion only close to the N-ring as can be seen in FIG. 1(a) where the target is indicated at 10, the N-ring at 18, the cathode body at 14, and the erosion pattern at 20. FIG. 2(b) shows a normal erosion pattern 18 for nonpermeable targets obtained with an N-ring, as disclosed in co-pending application Ser. No. 492,831. Examination of the target of FIG. 2(a) indicates the arc is influenced to move toward the edge of the permeable target, for there is no reason to expect it to move specifically toward the N-ring otherwise. The early literature of magnetic fields applied to the vacuum arc indicates the arc moves most readily in the direction of greatest magnetic field density. Assuming this is the mechanism for forcing the arc to the edge of the target in FIG. 1(a), it appears the arc moves away from the permeable material that reduces field density.

Another insight relating to the containment mechanism is obtained from the work of Naoe and Yamanaka ("Vacuum-Arc Evaporation of Ferrites and Compositions of Their Deposits", Japanese Journal of Applied Physics, Vol. 10, No. 6, June 1971, copy submitted herewith), who arc-evaporated ferrite composites from a cup-shaped ferrite target. They were attaining a melted portion of the target, and the oxide materials behaved very differently from the metals. They reported a very stable arc that moved in a very slow circular motion at the approximate center of the cup. They made no reference to this as unusual behavior, but gave considerable detail of the arc motion as observed visually. Implications relative to general arc containment were lacking.

To better understand this phenomenon, the assignee of the present invention has used a DC current through a wire to generate a cylindrical magnetic field of the type that the arc appears to produce close to the target. This wire has been brought into proximity to various geometries of permeable targets and "iron filings" diagrams produced to give insights to the magnetic influence of these permeable materials on the magnetic field.

It should be noted this is somewhat different from the application of a magnetic field to interact with the arc field as applied in aforementioned U.S. Pat. Nos. 2,972,695 and 3,783,231, for no external field is applied. When current is passed through the wire, magnetic flux is generated symmetrically around the wire. When two wires are placed in parallel with current in the same direction through them, the wires are pulled toward each other. The field generated between the wires is cancelled, for the flux direction is different on the right versus the left of the wire. When the carrying current wire is brought near a permeable surface, the wire, regardless of current direction, is pushed toward it.

In actuality, an arc is quite unique, and modeling it as a wire with current flowing is not a true indicator of what an arc will do. If sufficient current is permitted to flow in the arc, it will divide itself into two simultaneous arc spots moving independently about the cathode surface. This is quite the reverse of the wires which move together as current flows. Simple explanation of this difference between the arc and the wire is sometimes given in terms of the electrons being free to move sideways in space in the arc, but being confined within the wire. They try to move sideways in the wire, creating equal and opposite forces on the wires. Thus, the wire moves opposite to the direction the arc moves where the magnitude of the force moving an arc toward the edge of a permeable target is significant relative to the random motion forces that typically move the arc about a non-permeable target. The ability of the N-ring to contain the arc was a true test of the N-ring. Closely spaced electrostatic shields that work to a fair degree on non-permeable targets tend to fail quite totally on permeable targets, for the arc is quickly forced into the gap where it extinguishes.

Figure 3A:
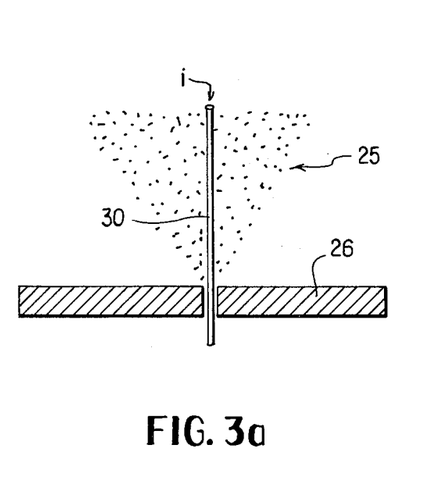
FIGS. 3(a), 3(b), 4(a), and 4(b) are schematic "iron filings" diagrams in cross-section which illustrate various conditions of permeable and non-permeable targets.
Figure 3B:
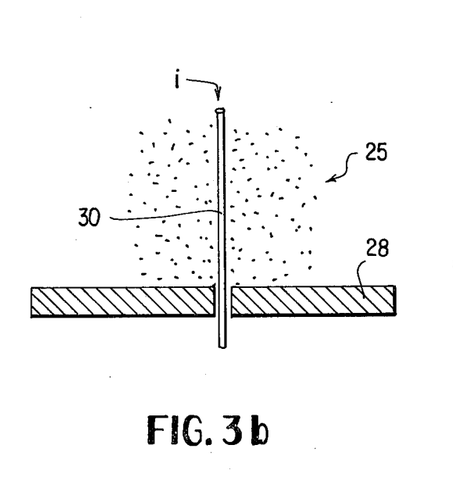
Figure 4A:
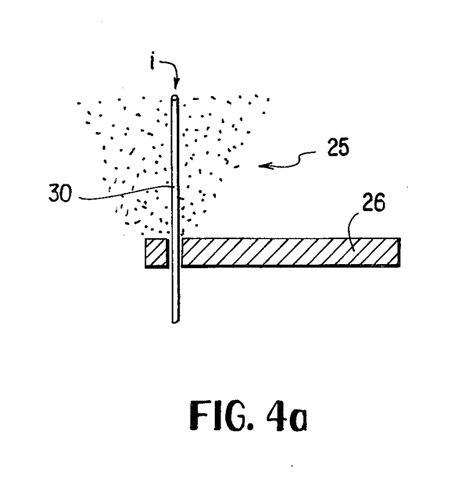
Figure 4B:
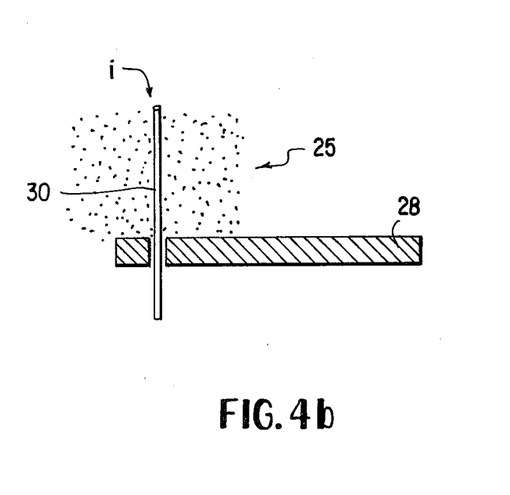

FIGS. 3(a), 3(b), 4(a) and 4(b) show the nature of the filing diagrams from the various conditions of permeable and non-permeable targets. In FIG. 3(a), less and less flux density 25 is seen as the iron plate 26 is approached, for these lines (of which only the cross-sections are seen) are drawn into the iron, for they travel more easily there. In the case of the aluminum target 28, the flux remains very constant as the plate is approached, as can be seen in FIG. 3(b). Moving to the target edge, as in FIG. 4(b), makes no change in the case of the aluminum target. However, as shown in FIG. 4(a), movement to the edge of the iron target produces a reasonably strong flux outboard of the target, and virtually none inboard. With the force on the arc thus outward, it is quite understandable that the arc races for the outside edge. The forces will be nil when the arc is perfectly in the target center, but normal random migration from the arc action will quickly push it off center. As it gets closer to an edge, the force toward the edge multiplies. It is thus quite logical that erosion would occur as shown in FIG. 2(a), for the arc is trapped between the induced electromagnetic force outward, and the N-ring which prevents the arc from moving further outward. There is relative freedom of motion only into the plane of FIG. 2(a). Thus the arc moves around the target perpendicularly to the trap. The attempt here is not to fully define the arc motion, but only to show certain aspects of it can be significantly influenced for purposes of control through the use of permeable deflectors separate from the target.

Furthermore, it follows that in the embodiment of FIG. 1, there is less flux density as the permeable ring is approached by an arc for the lines of force more easily travel in the ring. In particular, the magnetic field generated by the current of the vacuum arc interacts with the permeable stop ring to provide full containment of the arc upon the target. Accordingly, the force on the arc is away from the ring toward the area of greater flux density of the target.

Figure 7:
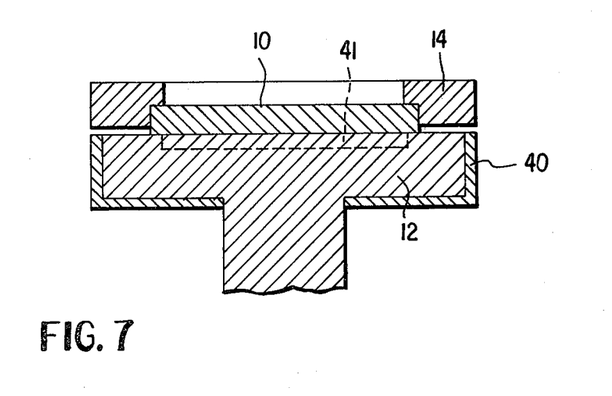
FIG. 7 is a schematic diagram in cross-section illustrating the use of magnetic shields in accordance with one aspect of the invention.

Moreover, the often observed and reported sensitivity of the arc to magnetic interaction is thus better understood in terms of the foregoing mechanism. Uneven target erosion is observed from the influence of distant magnetic influences such as the cord bringing DC power to the arc cathode. An obvious problem in coating permeable substrates will be the effects of magnetic residuals in same. However, these problems can be overcome in accordance with one aspect of the invention where permeable deflectors are employed for arc control. Such deflectors can markedly reduce the sensitivity to these weak outside magnetic influences, for the deflectors can serve as a magnetic shield. In this regard, note FIG. 7 which illustrates the use of a permeable magnetic shield 40 which serves to shield non-permeable target 10 from such distant magnetic influences. It should also be noted a sheet 41 of permeable material may be placed on the underside of non-permeable target 10 either in addition to or in lieu of shield 40 whereby sheet 41 would also intercept weak outside magnetic influences.

Naoe et al., cited above, describe the arc motion in a permeable crucible as being extremely slow and methodical. There are many physical and chemical differences between their work and the present invention. Visual observation of the arc of the present invention suggests a relatively slow paced, jerky random motion about the non-permeable cathode surface. However, a newly polished target which has had the arc active on it for only about one second shows nearly uniform significant erosion over its entire surface. The velocity with which the arc spot has made its random walk is obviously very much greater than the phenomenon observed optically. It is probable only lines of arc progression are seen that get worked progressively and repeatedly—with much faster running that is too fast and random to be seen as other than a general brightness occurring in between. There are even two kinds (and mechanisms) of spots reported. (See, for example, V. Rakhovskii, "Experimental Study of the Dynamics of Cathode Spots Developments", IEEE Transactions on Plasma Science, Vol. PS-4, No. 2, June 1976, copy submitted herewith.) Thus, it is not known how to interpret Naoe's observations. Does their arc move very slowly, or do they see only the progressive and repetitive aspects of it? They arc from a highly electron-emitting material, and from a truly molten state—in addition to being inside a highly permeable tube. Thus, it cannot be clearly deduced from their work the sole influence of only the tube of permeable material. Accordingly, the assignee of the present application conducted a special set of experiments to determine if fast motion is suspended in this relatively magnetic field-free area, these tests being illustrated in FIGS. 5(a), 5(b), 6(a), and 6(b). If fast motion is suspended, this would be a matter for concern in that uniform arc motion over the entire effective target area is preferred to optimize target utilization, and too much influence from a deflector would prevent this. It would appear the ferrite materials may present a worst case, and less permeable materials, such as mild steel, present more easily managed deflector materials. It would also appear that the effect can be under done. If it can be over done, then the correct answer lies in between with some degree of uniqueness.

Figure 5A:
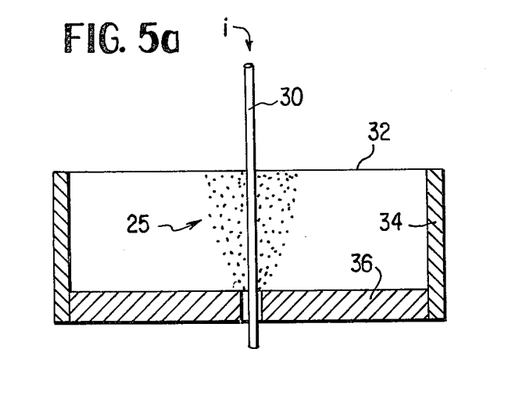
FIGS. 5(a), 5(b), 6(a), and 6(b) are schematic "iron filings" diagrams in cross-sectron which illustrate various conditions of permeable magnetic shields in combination with permeable and non-permeable targets.

FIG. 5(a) shows a situation most similar to Naoe et al. where a current carrying conductor 30 is centered in an iron dish 32 including a 5 inch diameter, iron tube 34 and an iron bottom plate 36. In the tube 34 used to check iron filings the results were indistinguishable from FIG. 3(a). Of course, the absolute intensity of the field about the wire is not established in this rudimentary measurement. The magnetic field intensity decreases with diameter of the ring, and its permeability. Ring height also is a factor in this same direction.

Figure 5B:
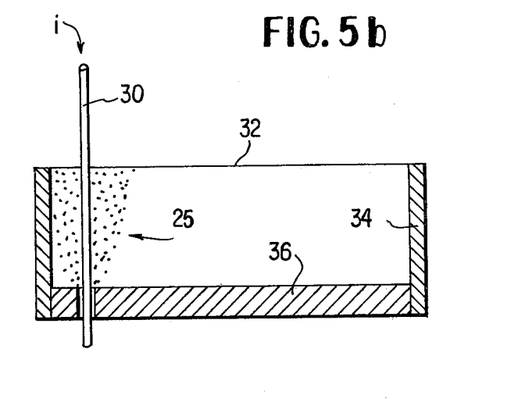
Figure 6A:
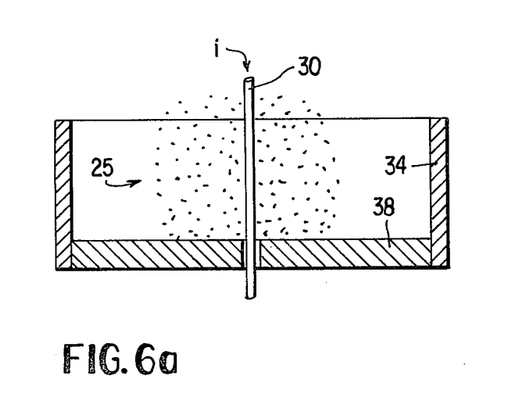
Figure 6B:
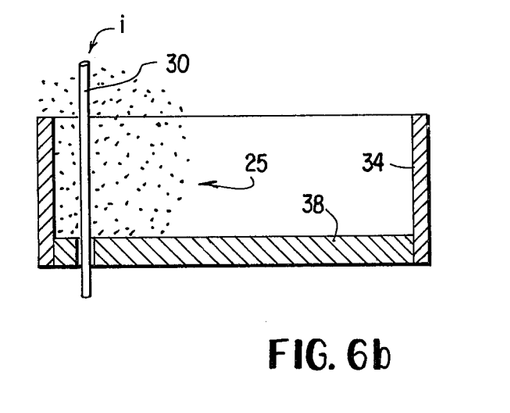

FIG. 5(b) shows a stronger field inboard of wire 30, almost the opposite from FIG. 4(a). The field inboard would pull an arc away from the ring. In FIGS. 6(a) and (b), iron ring 34 is used with a non-permeable (aluminum) target 38. The results do not show reduced field close to the target as in the FIG. 5 cases.

In addition to confining the arc to the opted target area, it is desirable that the confining mechanism not destroy the uniform erosion of the target. The N-ring does this by having no influence unless the arc encroaches upon it. The P-ring will have some distance effects, however. Thus, its design is important. Too tall and heavy a P-ring will cause the arc to stay too well centered, giving a shallow cup-shaped erosion. Too short and light a ring will permit the arc to attack the ring, if it is at cathode potential. Lowering the ring until a correct balance is achieved is thus important. In some cases, the "N" and "P" effects may be combined by coating a permeable ring with nitride. The above described experiments thus indeed did verify the theory as understood by applicant.

An arc repeatedly races from the face of an unguarded non-permeable target, often in a few tenths of a second. However, if, for example, ring 14 of FIG. 1 comprises a simple soft iron ring of $\frac{1}{8}''$ thickness placed tightly around the edge of target 10, ring 14 needs to rise above the target surface by only about $\frac{1}{8}''$ to provide quality arc containment. This iron ring is quickly coated with target material and in a large number of tests has shown no cases of the arc moving onto the coated iron band. It is only when the ring is lowered to practically flush with the target that the arc again moves off the edge. A preferable upper limit for the height of the ring above the target is about $\frac{1}{4}''$ in order that the arc not be confined too much around the central area of the target although it is to be understood, in many instances, this upper limit can be substantially exceeded.

It is noted the permeable material of the stop ring has a higher arc voltage than that of the target material. It is reported in the literature that once an arc wanders off of a higher arc voltage material to a lower, it will not return. This is given only passing comment. But it does present an additional possible way to provide arc containment. Furthermore, there is the question as to what happens when a sufficient layer of the lower voltage target material coats on the other. In any event, iron is listed as the highest arc voltage metal, so the arc-stop of the present invention is advantageous in both respects—that is, high arc voltage and permeability. It is thought, however, the permeability is the primary factor in that the arc tends to stay almost too far away from the confinement ring—with some modification of the erosion pattern. This is quite different from the target retained by an N-ring which erodes very uniformly to very close to the ring. Yet the P-ring of the present invention is very advantageous due to its rugged, yet inexpensive construction.

It should also be noted that when arc current is increased such that two cathode spots occur, they appear to spend most of the time at greater distances from the target center than when only a single cathode spot is active. This follows from the foregoing simple model, for the magnetic field between the spots should cancel, whereby the spots move apart in pursuit of the stronger field. The spots thus have repulsion from the P-ring and from each other. The result is a wider erosion pattern than achieved by a single spot. It is thus possible to tailor the target erosion by changing the current flow.

Figure 8A:
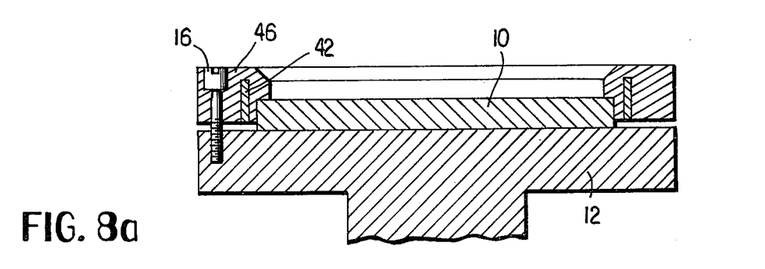
FIGS. 8(a) and 8(b) are schematic diagrams in cross-section illustrating the use of permeable inserts in non
Figure 8B:
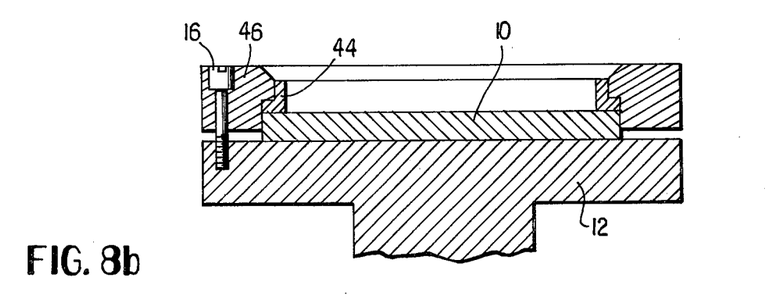
Figure 9A:
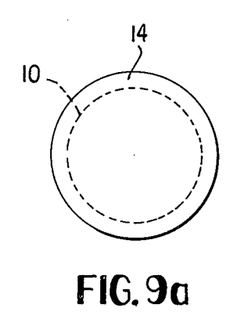
- FIGS. 9(a) and 9(b) are an end view and a cross-sectional side elevation view respectively of an illustrative non-planar target with P-ring stops.
Figure 9B:
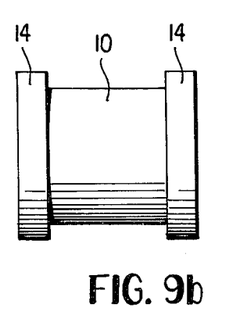
Figure 10A:
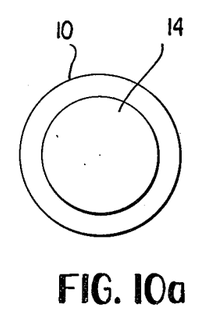
Figure 10B:
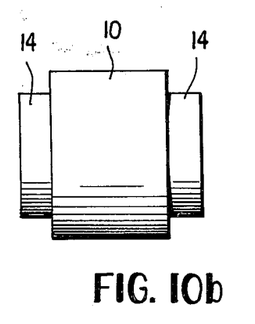
Figure 11A:
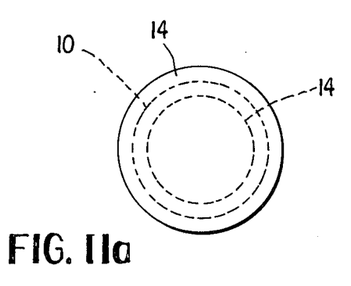
FIGS. 11(a) and 11(b) are an end view and a cross-sectional side elevation view respectively of yet a further non-planar target with P-ring stops.
Figure 11B:
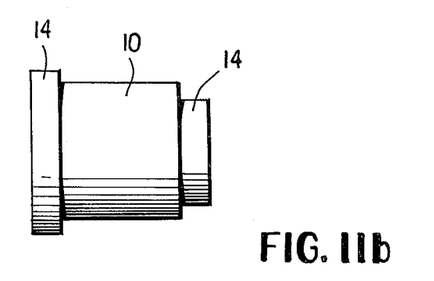

Referring now to FIGS. 8(a) and 8(b), it can be seen that rather small quantities of permeable material are required to keep the arc on non-permeable target 10 such as permemable inserts 42 and 44. Thus, as can be seen in FIGS. 8(a) and 8(b), non-permeable target clamps 46 need only carry an insert 42 or 44 of iron or other permeable material to provide the containment function.

Referring now to FIGS. 9–12, there are illustrated extensions of the P-ring concept to non-planar target configurations. As can be seen, the permeable stop can be adapted to a wide range of configurations and represents a fundamental concept where in each figure, the non-permeable target is indicated as 10 and the permeable stop as 14.

Figure 12A:
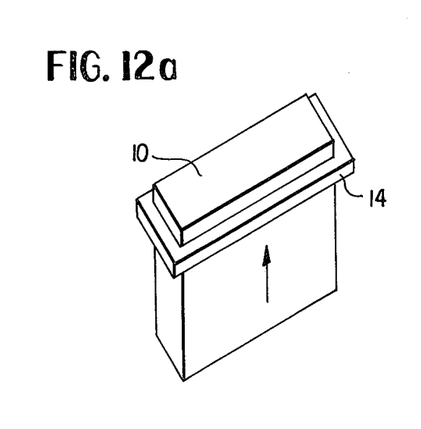
FIGS. 12(a) and 12(b) are perspective views illustrating extended planar forms of the embodiments of FIGS. 9 and 10 respectively.
Figure 12B:
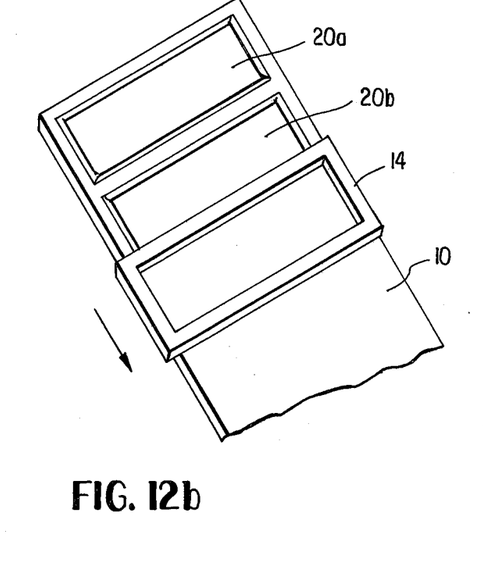

Both of the embodiments of FIGS. 9 and 10 operate well, thus a combination of one-half of each of the two also works, see FIG. 11. The embodiments of FIGS. 9–11 can be extended to form rectangular targets. It should be noted no driving force is observed on the arc to cause it to uniformly cover an extended target, thus, extending the dimensions too far can result in non-uniformity of erosion. FIGS. 12(a) and 12(b) show the extended planar forms of FIGS. 9 and 10 respectively. These are unique in that the rings 14 may be moved in the direction of the arrows over a larger target 10 to provide sequential, local use as indicated at 20a and 20b of FIG. 12(b), for example.

As stated hereinbefore, literature repeatedly stresses the need for ultra-clean conditions for the target assembly, but gives little description of the behavior of an unclean target contaminated with oxides and the like. It is indicated the oxides are evaporated (or exploded) from the surface before meaningful metal evaporation can start. Most of the removal of these contaminants occurs during the initial cleaning phase of the target with the substrate, in some instances, removed from the system. During this time, so-called type-one cathode spots are formed which do not effectively evaporate the target. Only after the contaminants have been effectively removed, are the type-one spots replaced by so-called type-two spots which are effective to evaporate the target. At this time, the substrate may be placed in the system preparatory to coating thereof if not already in place.

The N-ring appears to restrain the arc to the target during the initial cleaning phase even when the target is assembled in a dirty state. The P-ring is not that absolute a repellant, so that the arc may run upon the target and ring 16 for the first few starts of the arc during the initial cleaning phase. Once the target is sufficiently clean to evaporate target material, it coats the portion of the ring immediately adjacent the target, and the control of the arc becomes quite absolute. However, during the initial cleaning phase, the arc can move onto the back and sides of the cathode body 12 where it may damage the structure, or evaporate contaminating metals into the chamber.

Figure 13A:
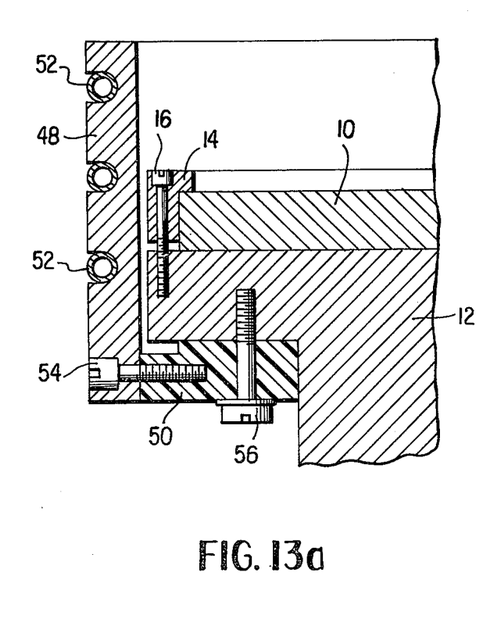
FIGS. 13(a) and 13(b) are schematic diagrams in cross section illustrating the use of permeable restraints to facilitate initial, arc-cleaning of a target.
Figure 13B:
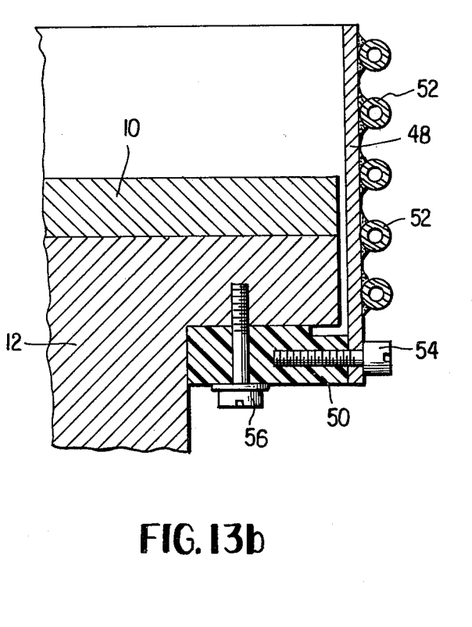

Reference should now be made to FIGS. 13(a) and 13(b), where FIG. 13(a) is the approximate left half of a symmetrical figure of revolution and FIG. 13(b) the approximate right half of such a figure. Each of these embodiments are effective to prevent the arc that gets on P-ring 14, during the initial cleaning phase, from moving onto the cathode body. In particular, in FIG. 13(a), a non-permeable electrode 48 is closely spaced, that is - less than ⅛" and preferably between 1/32 to 1/16", from P-ring 14 where the electrode may be above or about the ring. Preferably, at least during the initial cleaning phase, all parts of the cathode should see anode potential. Hence, electrode 48 should, at this time either be biased to anode potential or, if floating, this potential should be induced thereon. The FIG. 13(a) embodiment also includes an insulator 50 for electrically isolating electrode 48 from cathode body 12, cooling pipes 52, bolts 54 for securing electrode 48 to insulator 50, and bolts 56 for securing the insulator to cathode body 12.

In operation, during the initial clean up phase, the arc, as stated above, may run up on P-ring 14. However, if it attempts to run off the ring, it will be extinguished as it moves into the space between it and electrode 48. Thus, the arc is prevented from moving onto the cathode body where damage and/or contamination may occur.

Closely spaced shields have been used hereinbefore to prevent an arc from moving from a target to the cathode or the like. However, it has been a further teaching heretofore that the shield or anode must remain closely spaced to the target, not only during the initial cleaning phase but also during the target evaporation phase when the target material is coated on the substrate. In accordance with the present invention, not only is electrode 48 employed to maintain the arc on P-ring 14 but also it may be removed or relocated to a different area of the chamber once the initial cleaning phase is completed. That is, once it is completed, the target can be evaporated, as stated above, such that the portion of P-ring 14 immediately adjacent the target is coated with target material and control becomes quite absolute such that even a single spot can operate for many hours without extinguishing or encroaching. Hence, electrode 48 may be moved away from the ring and employed for other purposes if desired. In FIG. 13(b), electrode 48 is made of a permeable material and thus the P-ring 14 is effectively incorporated into the electrode 48. Furthermore, the non-permeable target 10 may be bonded to cathode body 12. In operation, electrode 48 of FIG. 13(b) functions in the same way as electrode 48 of FIG. 13(a) to prevent cathode body contamination or the like during the initial cleaning phase.

It is to be understood that the above detailed description of the various embodiments of the invention is provded by way of example only. Various details of design and construction may be modified without departing from the true spirit and scope of the invention as set forth in the appended claims.

I claim:

1. Apparatus for evaporation arc stabilization comprising
    a target having a surface of non-permeable material to be evaporated;
    means for establishing an arc on the target surface for evaporating the target material, the arc being characterized by the presence of charged particles and a cathode spot which randomly migrates over said target surface;
    a confinement ring surrounding the target surface, the ring being composed of a magnetically permeable material to thereby confine the cathode spot to the target surface; and
    means for preventing said arc from moving off said target and confinement ring in response to said arc being initially applied to said target and ring to effect cleaning of contaminants therefrom.

2. Apparatus as in claim 1 where said preventing means includes an electrode closely spaced to said confinement ring.

3. Apparatus as in claim 2 where said electrode is at anode potential.

4. Apparatus as in claim 3 where said electrode is biased to said anode potential.

5. Apparatus as in claim 3 where said electrode is electrically floating and induced to said anode potential.

6. Apparatus as in claim 2 where said electrode is composed of a permeable material.

7. Apparatus as in claim 2 where said electrode is spaced no more than ⅛ inch from said ring.

8. Apparatus as in claim 7 where said electrode is spaced, about 1/32 to 1/16 inch from said ring.

9. Apparatus as in claim 2 including means for moving said electrode away from its closely spaced relationship with respect to the ring after said contaminants have been cleaned from the target and ring.

10. Apparatus as in claim 1 where the mean charged particle energies of said arc are 20–100 eV.

11. Apparatus as in claim 10 where the mean charged particle energies of said arc are 40–60 eV.

12. Apparatus as in claim 1 including a substrate upon which the evaporated target material is deposited as a coating.

13. Apparatus as in claim 1 where the permeable material is selected from the group consisting of iron and Permalloy.

14. Apparatus as in claim 1 where said ring extends above the target surface by at least about ⅛ inch.

15. Apparatus as in claim 14 where said ring extends above said target surface no more than about ¼ inch.

16. Apparatus as in claim 1 including permeable means for shielding said target from the influence of extraneous, external fields.

17. Apparatus as in claim 16 where said permeable means includes a cup-shaped member upon which said target is disposed.

18. Apparatus as in claim 16 where said permeable means includes a plate disposed on the side of the target opposite from the surface to be evaporated.

19. Apparatus as in claim 1 including a non-permeable clamp for holding said target in place within said apparatus; and said ring including an insert at least partially disposed within and held in place by said clamp.

20. Apparatus as in claim 19 where said insert is completely disposed within said clamp.

21. Apparatus as in claim 1 where said target is cylindrical in configuration and said confinement ring includes first and second members disposed at the respective ends of the said target.

22. Apparatus as in claim 21 where the diameters of said first and second confinement members are greater than that of the cylindrical target.

23. Apparatus as in claim 21 where the diameters of said first and second confinement members are less than that of the cylindrical target.

24. Apparatus as in claim 21 where the diameters of said first and second confinement members are respectively greater than and less than that of the cylindrical target.

25. Apparatus as in claim 1 where said target is planar and said confinement ring surrounds at least a portion of the target surface and where said apparatus includes means for relatively moving the target with respect to the confinement ring so that the confinement ring surrounds a further portion of the target surface to thereby confine the cathode spot to said further portion of the target surface.

26. Apparatus as in claim 1 where said target is relatively moved through said confinement ring.

27. Apparatus as in claim 1 where said confinement ring is relatively moved parallel to the plane of said target surface.

28. Apparatus as in claim 1 where said confinement ring comprises a substrate composed of said permeable material and a coating thereon selected from the group consisting of boron nitride, titanium nitride and mixtures thereof.

29. Apparatus for evaporation arc stabilization comprising
   a target having a surface of non-permeable material to be evaporated;
   means for establishing an arc on the target surface for evaporating the target material, the arc being characterized by the presence of charged particles and a cathode spot which randomly migrates over said target surface; and
   an electrode closely spaced from and surrounding the target surface, the electrode being composed of an magnetically permeable material to thereby confine the cathode spot to the target surface and prevent the arc from moving off the target in response to said arc being initially applied to said target and ring to effect cleaning of contaminants therefrom.

30. Apparatus as in claim 29 where said electrode is at anode potential.

31. Apparatus as in claim 30 where said electrode is biased to said anode potential.

32. Apparatus as in claim 30 where said electrode is electrically floating and induced to said anode potential.

33. Apparatus as in claim 29 where said electrode is spaced no more than ⅛ inch from said ring.

34. Apparatus as in claim 33 where said electrode is spaced about 1/32 to 1/16 inch from said ring.

35. Apparatus as in claim 29 including means for moving said electrode away from its closely spaced relationship with respect to the ring after said contaminants have been cleaned from the target and ring.

36. Apparatus as in claim 29 where the mean charged particle energies of said arc are 20–100 eV.

37. Apparatus as in claim 36 where the mean charged particle energies of said arc are 40–60 eV.

38. Apparatus as in claim 29 including a substrate upon which the evaporated target material is deposited as a coating.

39. Apparatus as in claim 29 where the permeable material is selected from the group consisting of iron and Permalloy.

40. Apparatus for evaporation arc stabilization comprising
   a target having a surface of non-permeable material to be evaporated;
   means for establishing an arc on the target surface for evaporating the target material, the arc being characterized by the presence of charged particles and a cathode spot which randomly migrates over said target surface; and
   a confinement ring surrounding the target surface, the ring being composed of a magnetically permeable material and extending above the target surface by at least about ⅛ inch to thereby confine the cathode spot to the target surface.

41. Apparatus as in claim 40 where said ring extends above said target surface no more than about ¼ inch.

42. Apparatus as in claim 40 where the mean charged particle energies of said arc are 20–100 eV.

43. Apparatus as in claim 42 where the mean charged particle energies of said arc are 40–60 eV.

44. Apparatus as in claim 40 including a substrate upon which the evaporated target material is deposited as a coating.

45. Apparatus as in claim 40 where the permeable material is selected from the group consisting of iron and Permalloy.

46. Apparatus for evaporation arc stabilization comprising
   a target having a surface of non-permeable material to be evaporated;
   means for establishing an arc on the target surface for evaporating the target material, the arc being characterized by the presence of charged particles and a cathode spot which randomly migrates over said target surface;
   a confinement ring surrounding the target surface, the ring being composed of a material which confines the cathode spot to the target surface; and
   permeable means for shielding said target from the influence of extraneous, external magnetic fields.

47. Apparatus as in claim 46 where said material is magnetically permeable.

48. Apparatus as in claim 46 where said material is selected from the group consisting of boron nitride, titanium nitride, and mixtures thereof.

49. Apparatus as in claim 46 where said permeable means includes a cup-shaped member upon which said target is disposed.

50. Apparatus as in claim 46 where said permeable means includes a plate disposed on the side of the target opposite from the surface to be evaporated.

51. Apparatus as in claim 46 where the mean charged particle energies of said arc are 20–100 eV.

52. Apparatus as in claim 51 where the mean charged particle energies of said arc are 40–60 eV.

53. Apparatus as in claim 46 including a substrate upon which the evaporated target material is deposited as a coating.

54. Apparatus as in claim 46 where the permeable material is selected from the group consisting of iron and Permalloy.

55. Apparatus for evaporation arc stabilization comprising
   a target having a surface of non-permeable material to be evaporated;
   means for establishing an arc on the target surface for evaporating the target material, the arc being characterized by the presence of charged particles and a cathode spot which randomly migrates over said target surface;
   a confinement ring surrounding the target surface, the ring being composed of a magnetically permeable material to thereby confine the cathode spot to the target surface;
   a non-permeable clamp for holding said target in place within said apparatus; and
   said ring including an insert at least partially disposed within and held in place by said clamp.

56. Apparatus as in claim 55 where said insert is completely disposed within said clamp.

57. Apparatus as in claim 55 where the mean charged particle energies of said arc are 20–100 eV.

58. Apparatus as in claim 57 where the mean charged particle energies of said arc are 40-60 eV.

59. Apparatus as in claim 55 including a substrate upon which the evaporated target material is deposited as a coating.

60. Apparatus as in claim 55 where the permeable material is selected from the group consisting of iron and Permalloy.

61. Apparatus for evaporation arc stabilization comprising
a cylindrical target having a surface of nonpermeable material to be evaporated;
means for establishing an arc on the target surface for evaporating the target material, the arc being characterized by the presence of charged particles and a cathode spot which randomly migrates over said target surface; and
first and second confinement members disposed at the respective ends of said target, the confinement members being composed of a magnetically permeable material to thereby confine the cathode spot to the target surface.

62. Apparatus as in claim 61 where the diameters of said first and second confinement members are greater than that of the cylindrical target.

63. Apparatus as in claim 61 where the diameters of said first and second confinement members are less than that of the cylindrical target.

64. Apparatus as in claim 61 where the diameters of said first and second confinement members are respectively greater than and less than that of the cylindrical target.

65. Apparatus as in claim 61 where the mean charged particle energies of said arc are 20-100 eV.

66. Apparatus as in claim 65 where the mean charged particle energies of said arc are 40-60 eV.

67. Apparatus as in claim 61 including a substrate upon which the evaporated target material is deposited as a coating.

68. Apparatus as in claim 61 where the permeable material is selected from the group consisting of iron and Permalloy.

69. Apparatus for evaporation arc stabilization comprising
a planar target having a surface of non-permeable material to be evaporated;
means for establishing an arc on the target surface for evaporating the target material, the arc being characterized by the presence of charged particles and a cathode spot which randomly migrates over said target surface;
a confinement ring surrounding at least a portion of the target surface, the ring being composed of a magnetically permeable material to thereby confine the cathode spot to said portion of the target surface; and
means for relatively moving the target with respect to the confinement ring so that the confinement ring surrounds a further portion of the target surface to thereby confine the cathode spot to said further portion of the target surface.

70. Apparatus as in claim 69 where said target is relatively moved through said confinement ring.

71. Apparatus as in claim 69 where said confinement ring is relatively moved parallel to the plane of said target surface.

72. Apparatus as in claim 69 where the mean charged particle energies of said arc are 20-100 eV.

73. Apparatus as in claim 72 where the mean charged particle energies of said arc are 40-60 eV.

74. Apparatus as in claim 69 including a substrate upon which the evaporated target material is deposited as a coating.

75. Apparatus as in claim 69 where the permeable material is selected from the group consisting of iron and Permalloy.

76. Apparatus for evaporation arc stabilization comprising
a target having a surface of non-permeable material to be evaporated;
means for establishing an arc on the target surface for evaporating the target material, the arc being characterized by the presence of charged particles and a cathode spot which randomly migrates over said target surface; and
a confinement ring surrounding the target surface, the ring comprising a substrate composed of a magnetically permeable material and a coating thereon selected from the group consisting of boron nitride, titanium nitride and mixtures thereof to thereby confine the cathode spot to the target surface.

77. Apparatus as in claim 76 where the mean charged particle energies of said arc are 20-100 eV.

78. Apparatus as in claim 77 where the mean charged particle energies of said arc are 40-60 eV.

79. Apparatus as in claim 76 including a substrate upon which the evaporated target material is deposited as a coating.

80. Apparatus as in claim 76 where the permeable material is selected from the group consisting of iron and Permalloy.

81. A method of evaporation arc stabilization comprising the steps of
establishing an arc on a surface of a target of non-permeable material to evaporate the target, the arc being characterized by the presence of charged particles and a cathode spot which randomly migrates over said target surface;
confining the arc to the target surface with a confinement ring which surrounds the target surface, the ring being composed of a magnetically permeable material; and
preventing said arc from moving off said target and confinement ring in response to said arc being initially applied to said target and ring to effect cleaning of contaminants therefrom.

82. A method as in claim 81 where said preventing step is effected by an electrode closely spaced to said confinement ring.

83. A method as in claim 82 where said electrode is at anode potential.

84. A method as in claim 83 where said electrode is biased to said anode potential.

85. A method as in claim 82 where said electrode is electrically floating and electrically induced to said anode potential.

86. A method as in claim 82 where said electrode is composed of a permeable material.

87. A method as in claim 81 where the mean charged particle energies of said arc are 20-100 eV.

88. A method as in claim 87 where the mean charged particle energies of said arc are 40-60 eV.

89. A method as in claim 81 including depositing the evaporated target material on a substrate as a coating.

90. A method as in claim 82 where said electrode is spaced no more than ⅛ inch from said ring.

91. A method as in claim 90 where said electrode is spaced about 1/32 to 1/16 inch from said ring.

92. A method as in claim 81 including moving said electrode away from its closely spaced relationship with respect to the ring after said contaminants have been cleaned from the target and ring.

93. A method of evaporation arc stabilization comprising the steps of
establishing an arc on a surface of a target of non-permeable material to evaporate the target, the arc being characterized by the presence of charged particles and a cathode spot which randomly migrates over said target surface; and
confining the arc to the target surface with an electrode which is closely spaced from and surrounds the target surface, the electrode being composed of a magnetically permeable material to thereby confine the cathode spot to the target surface and prevent the arc from moving off the target in response to said arc being initially applied to said target and ring to effect cleaning of contaminants therefrom.

94. A method as in claim 93 where said electrode is at anode potential.

95. A method as in claim 94 where said electrode is biased to said anode potential.

96. A method as in claim 93 where said electrode is electrically floating and induced to said anode potential.

97. A method as in claim 93 where the mean charged particle energies of said arc are 20–100 eV.

98. A method as in claim 97 where the mean charged particle energies of said arc are 40–60 eV.

99. A method as in claim 93 including depositing the evaporated target material on a substrate as a coating.

100. A method as in claim 93 where said electrode is spaced no more than ⅛ inch from said ring.

101. A method as in claim 100 where said electrode is spaced about 1/32 to 1/16 inch from said ring.

* * * * *